(12) United States Patent
Torii et al.

(10) Patent No.: US 8,603,383 B2
(45) Date of Patent: Dec. 10, 2013

(54) ORIGINAL AND ARTICLE MANUFACTURING METHOD USING SAME

(75) Inventors: Hirotoshi Torii, Utsunomiya (JP); Yusuke Tanaka, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 214 days.

(21) Appl. No.: 13/223,415

(22) Filed: Sep. 1, 2011

(65) Prior Publication Data
US 2012/0056350 A1 Mar. 8, 2012

(30) Foreign Application Priority Data
Sep. 6, 2010 (JP) ................... 2010-198432

(51) Int. Cl.
*B28B 7/00* (2006.01)
*G03F 1/00* (2012.01)
*G03F 7/26* (2006.01)

(52) U.S. Cl.
USPC ........ 264/299; 264/496; 425/174.4; 425/470; 430/5

(58) Field of Classification Search
None
See application file for complete search history.

(56) References Cited

U.S. PATENT DOCUMENTS

| | | | | |
|---|---|---|---|---|
| 4,668,557 A * | 5/1987 | Lakes | | 428/131 |
| 7,140,861 B2 * | 11/2006 | Watts et al. | | 425/174.4 |
| 7,150,622 B2 * | 12/2006 | Choi et al. | | 425/385 |
| 7,420,654 B2 * | 9/2008 | Cherala et al. | | 355/72 |
| 2006/0096949 A1 * | 5/2006 | Watts et al. | | 216/41 |
| 2011/0074062 A1 * | 3/2011 | Henderson et al. | | 264/259 |

FOREIGN PATENT DOCUMENTS

JP 2008-504141 A 2/2008

* cited by examiner

*Primary Examiner* — Mary F Theisen
(74) *Attorney, Agent, or Firm* — Rossi, Kimms & McDowell LLP

(57) ABSTRACT

The original of the present invention has a pattern to be transferred. For example, the original of the present invention is a mold for use in an imprint apparatus or a mask for use in an exposure apparatus. The original has a negative effective Poisson's ratio. Alternatively, the original has an effective Poisson's ratio smaller than that of a quartz glass plate.

9 Claims, 4 Drawing Sheets

ORIGINAL AND ARTICLE MANUFACTURING METHOD USING SAME

BACKGROUND OF THE INVENTION

1. Field of the Invention

The present invention relates to an original (for example, a mold to be used in an imprint apparatus or a mask to be used in an exposure apparatus) and an article manufacturing method using the same.

2. Description of the Related Art

As the demand for microfabrication of semiconductor devices increases, not only is there a conventional photolithography technique, but there is also a microfabrication technique in which a mold (original) and an uncured resin on a substrate are pressed against each other to thereby form a resin pattern, which corresponds to a fine concave and convex pattern formed on the mold, on the substrate. This technique is also referred to as an "imprint technique", by which a fine structure on the order of a few nanometers can be formed on the substrate. One example of imprint techniques includes a photo-curing method. Firstly, the photo-curing method applies an ultraviolet curable resin (imprint resin, photocurable resin) to the shot area (imprint area) on the substrate. Next, the resin (uncured resin) and a mold are pressed against each other. After the ultraviolet curable resin is irradiated with ultraviolet light for curing, the cured resin is released from the mold, whereby a resin pattern is formed on the substrate.

An imprint apparatus employing the aforementioned technology corrects the shape of a mold using a shape correction mechanism depending on the shape of a pattern on a substrate. At this time, shape correction includes not only simple magnification corrections but also corrections in which the shape of a mold is deformed into another shape such as a parallelogram or a trapezoid. In general, the shape correction mechanisms are installed in plural locations on the outer circumference portion of a mold. Each of the shape correction mechanisms imparts an external force to a mold from the outer circumference portion to thereby cause the mold itself to be deformed, so that the pattern shape formed on the mold is corrected. The pattern shape affects the superposition accuracy of the patterns. In particular, for the correction of the pattern shape using a shape correction mechanism, a highly accurate correction on the order of less than a few nanometers is required in order to accommodate the recent trend toward pattern micronization. As a device for correcting the shape of a pattern, such as a shape correction mechanism, Japanese Patent Laid-Open No. 2008-504141 discloses a device that applies a compressive force to the mold-side surface to thereby perform magnification correction. The device is constituted by an actuator, a link mechanism, and the like. The devices are installed in plural locations so as to enclose the outer circumference portion of a mold.

However, in the device disclosed in Japanese Patent Laid-Open No. 2008-504141, when a force is applied to a mold from the outer circumference portion thereof (for example, when a pattern is corrected into a trapezoidal shape), a large correction error may occur. Here, assume the case where a mold is formed of quartz having a positive Poisson's ratio. In this context, the device disclosed in Japanese Patent Laid-Open No. 2008-504141 applies a compressive force to one base for shortening the length thereof and a tensile force to the other base for extending the length thereof. In this case, the shortened base of the mold is bent inward and the extended base thereof is bent outward due to the effect of Poisson's ratio. Thus, a correction error newly occurs due to the shape correction of a pattern into a trapezoidal shape.

SUMMARY OF THE INVENTION

Accordingly, the present invention provides, for example, an original that is advantageous in terms of causing it to be deformed into a target shape.

According to a first aspect of the present invention, an original having a pattern to be transferred is provided that has a negative effective Poisson's ratio.

According to a second aspect of the present invention, a light-transmissive original has a pattern to be transferred, wherein the original has an effective Poisson's ratio smaller than that of a quartz glass plate.

The present invention can provide, for example, an original that is advantageous in terms of causing it to be deformed into a target shape.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.

(Imprint Apparatus)

Figure 1:
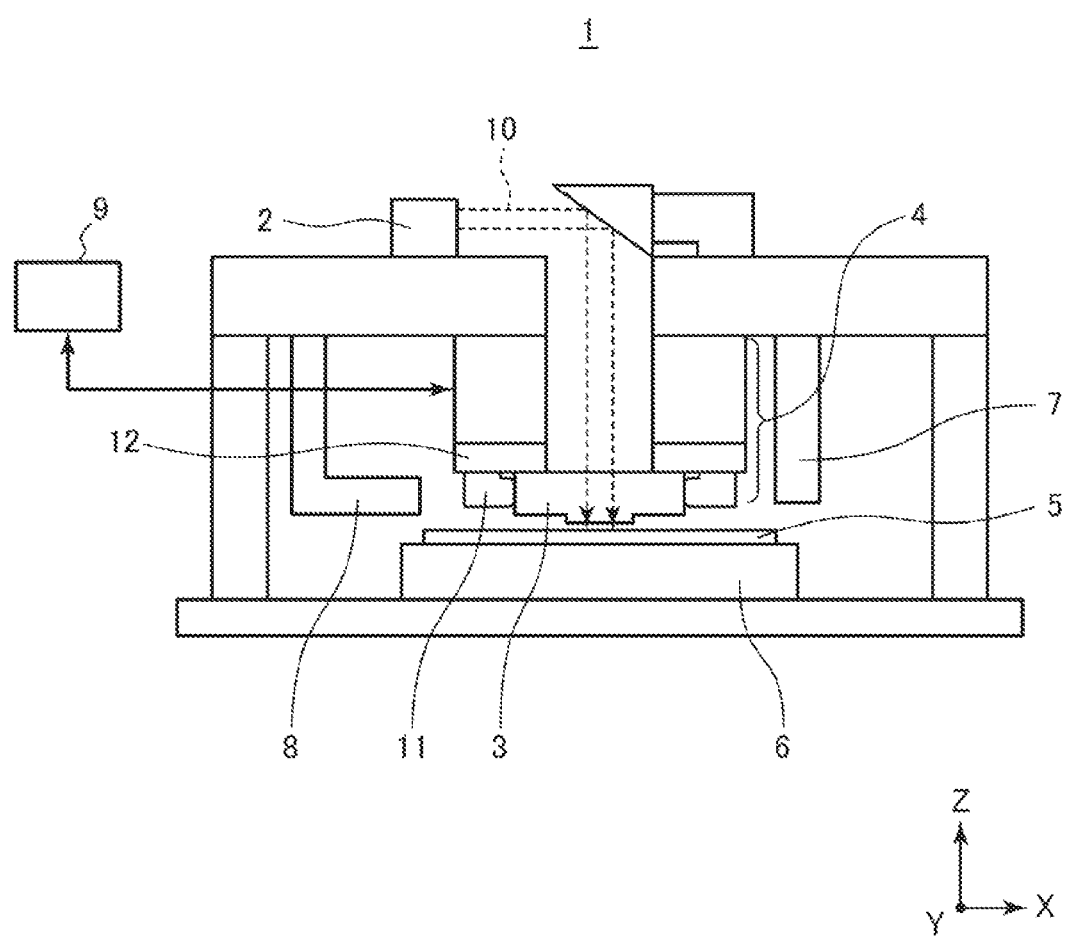
FIG. 1 is a schematic view illustrating the configuration of an imprint apparatus according to an embodiment of the present invention.

First, a description will be given of the configuration of an imprint apparatus according to an embodiment of the present invention. FIG. 1 is a schematic view illustrating the configuration of an imprint apparatus. The imprint apparatus according to the present embodiment is a processing apparatus that transfers the pattern of a mold to a wafer (a substrate), i.e., a substrate to be processed, which is used for a semiconductor device manufacturing process, and is an apparatus that employs a photo-curing method among the imprint techniques. In the following drawings, a description will be given in which the Z axis is oriented in parallel to the irradiation axis of ultraviolet light for a mold, the X axis is oriented in the direction in which a wafer moves with respect to a mold base to be described below in a plane perpendicular to the Z axis, and the Y axis is oriented in the direction perpendicular to the X axis. An imprint apparatus 1 of the present invention includes an illumination unit 2, a mold holding unit 4, a wafer stage 6, an application unit 7, a mold conveyance unit 8, and a controller 9.

The illumination unit 2 is an illumination unit configured to irradiate the mold 3 with an ultraviolet light 10 during imprint processing. The illumination system 2 is constituted by a light source and a plurality of optical elements that adjust ultraviolet light emitted from the light source to a light suitable for imprint. The mold holding unit 4 is a holding device that holds and fixes the mold 3. The mold holding device 4 includes a shape correction mechanism 11 that corrects the pattern formed on the mold 3 to a desired shape by applying a compressive force to the mold 3, and a mold base 12 that draws and holds the mold 3 by a suction force or an electrostatic force. The shape correction mechanism 11 consists of a plurality of driving mechanisms that are arranged so as to respectively face four side surface (peripheral side surface) areas of the mold 3. The correction components of the pattern to be corrected by the shape correction mechanism 11 include a magnification component, a parallelogram component, a trapezoidal component, a barrel component, a pincushion component, and the like. The configuration of the shape correction mechanism 11 is not limited thereto. For example, the shape correction mechanism 11 may apply a tensile force to the mold 3 or may drive the mold base 12 itself so as to impart a shearing force to the contact surface between the mold 3 and the mold base 12.

The mold holding unit 4 further includes a base driving mechanism (not shown) that drives the mold base 12. More specifically, the base driving mechanism is a driving system that drives the mold base 12 in the Z-axial direction so as to press the mold 3 against the ultraviolet curable resin formed on the wafer 5. An actuator employed for the driving mechanism is not particularly limited as long as it can drive at least in the Z-axial direction. A linear motor, an air cylinder, and the like can be employed. Alternatively, in order to perform a mold-release operation with high precision so as to prevent the cured ultraviolet curable resin from being damaged when a mold-release operation for releasing the mold 3 from the ultraviolet curable resin is performed, an actuator may be employed to carry out a coarse operation and a micro operation in a divided manner. The imprint operation and the mold-release operation may be realized by driving the mold 3 in the Z-direction as described above or may also be realized by driving the wafer stage 6 (the wafer 5) in the Z-direction.

The wafer 5 is a substrate to be processed consisting of, for example, a single crystal silicon, and an ultraviolet curable resin (hereinafter referred to simply as "resin"), which serves as a molding section, is applied on the treatment surface. Also, the wafer stage 6 is a substrate holding unit configured to hold the wafer 5 by vacuum suction and be freely moveable in the XY plane. As an actuator for driving the wafer stage 6, a linear motor can be employed, but this is not particularly limiting. The application unit (dispenser) 7 is an application unit configured to apply an uncured resin on the wafer 5. The resin is a photocurable resin having curing characteristics that is cured by ultraviolet light, and is appropriately selected depending on the type of a semiconductor device to be manufactured. Furthermore, the mold conveyance unit 8 is a conveyance unit configured to convey the mold 3 to thereby place the mold 3 on the mold base 12.

The controller 9 is a controller configured to control the operation, adjustment, and the like of the components of the imprint apparatus 1. The controller 9 is constituted by a computer, a sequencer, and the like having a magnetic storage medium and the like that is connected to the components of the imprint apparatus 1 through a circuit, and executes control of the components by a program or a sequence. Note that the controller 9 may be integrated with the imprint apparatus 1, or may be installed at a location separate from the location where the imprint apparatus 1 is installed to thereby be controlled remotely.

Next, a description will be given of imprint processing to be performed by the imprint apparatus 1. Firstly, the controller 9 causes the wafer 5 to be placed and fixed on the wafer stage 6, and then moves the wafer stage 6 to the application position of the application unit 7. Then, the application unit 7 applies a resin (uncured resin) to a predetermined shot (treatment area) of the wafer 5. Next, the controller 9 moves the wafer stage 6 such that the application surface on the wafer 5 is positioned below the mold 3. Next, the controller 9 performs alignment of the imprint surface of the mold 3 with the application surface on the wafer 5 and shape correction of the mold 3 using the shape correction mechanism 11, and then drives a base driving mechanism to thereby imprint the mold 3 into the resin that has been applied on the wafer 5. At this time, the resin flows along the pattern formed on the mold 3 by imprinting with the mold 3. Under this condition, the illumination unit 2 emits the ultraviolet light 10 from the rear side (upper side) of the mold 3, and the resin is cured by the ultraviolet light 10 that has been transmitted through the mold 3. Then, after the resin is cured, the controller 9 again drives the base driving mechanism to thereby release the mold 3 from the wafer 5. By the aforementioned steps, a three dimensionally shaped resin layer following the pattern of the mold 3 is formed on the shot surface of the wafer 5.

First Embodiment

Figure 2A:
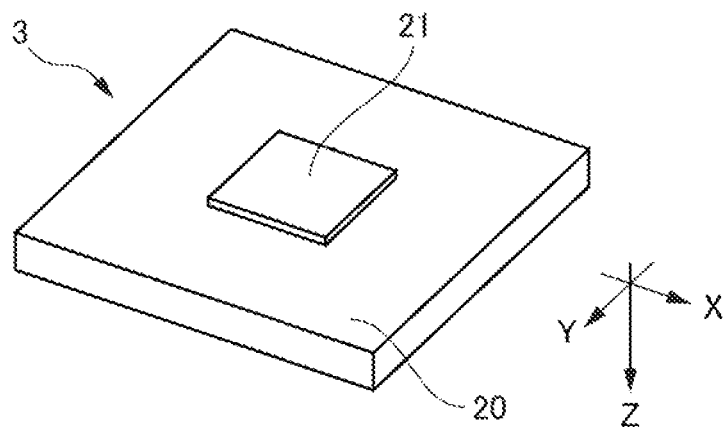
FIG. 2A is a perspective view illustrating a mold according to a first embodiment as seen from the wafer side.
Figure 2B:
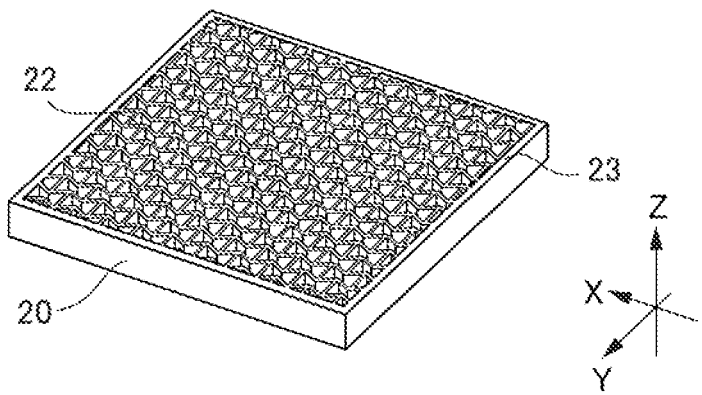
FIG. 2B is a perspective view illustrating a mold according to the first embodiment as seen from the mold base side.
Figure 2C:
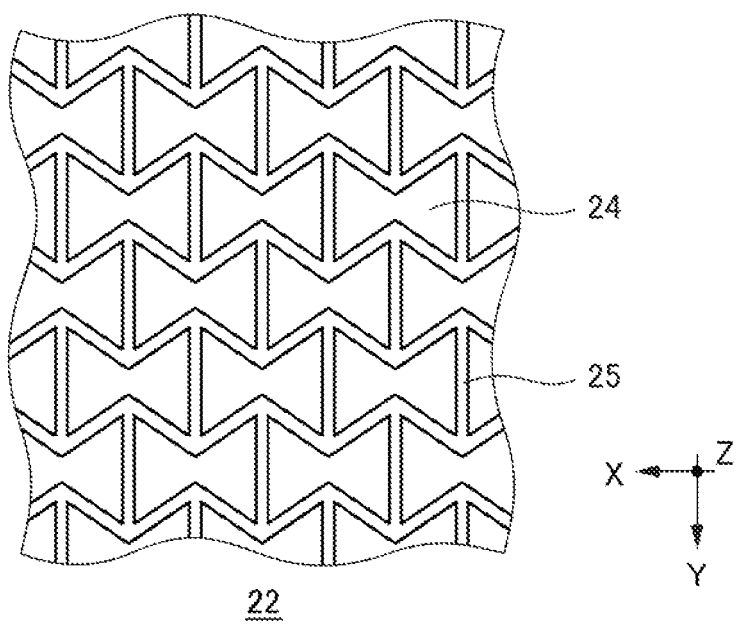
FIG. 2C is an enlarged plan view illustrating the auxetic structure of a mold according to the first embodiment.

FIGS. 2A to 2C are schematic views illustrating the shape of the mold 3 according to the first embodiment of the present invention. In particular, FIG. 2A is a perspective view illustrating the mold 3 as seen from the wafer 5 side (the surface side), and FIG. 2B is a perspective view illustrating the mold 3 as seen from the mold base 12 side (the rear side) facing the wafer 5 side. The mold 3 has a rectangular shape at an outer periphery thereof and is an original (mold) in which a predetermined pattern (e.g., the concave and convex pattern of a circuit pattern or the like) is three-dimensionally formed on the surface facing the wafer 5. The surface of the pattern is processed at high flatness so as to maintain the adhesion between the surfaces of the pattern and the wafer 5. Note that the material of the mold 3 is a material such as quartz (Poisson's ratio: 0.16) or the like through which ultraviolet light can pass.

As shown in FIG. 2A, the mold 3 is constituted by a base portion 20 serving as a main body portion, and a mesa portion (convex portion) 21 which protrudes in the center portion of the surface side of the base portion 20 and on which a pattern (not shown) is formed. The peripheral dimension and the height dimension of the mesa portion 21 are determined by a desired pattern shape. Also, as shown in FIG. 2B, the mold 3 (at least a part of the base portion 20) has an auxetic structure portion 22 provided on the back surface side thereof. The auxetic structure portion 22 is a structure having a negative Poisson's ratio. Poisson's ratio is categorized into two types: Poisson's ratio indicated by the material itself and Poisson's ratio indicated by the structure (body). Here, the term "effective Poisson's ratio" is defined with respect to an original. The expression "effective Poisson's ratio is negative" with respect to an original means that the original has a structure in which a portion including a pattern to be transferred (e.g., the mesa portion 21) is shrunk and deformed in the Y-direction when a compressive force is applied in the X-direction to the base portion (e.g., the base portion 20 shown in FIGS. 2A and 2B). The aforementioned expression also means that an original has a structure in which a portion including a pattern to be transferred is expanded and deformed in the Y-direction when a tensile force is applied in the X-direction to the base portion. The expressions "effective Poisson's ratio is positive" and "effective Poisson's ratio is zero" are defined in a similar manner.

Here, an original having a negative effective Poisson's ratio may be realized by the fact that at least a portion of a mold has a structure having a negative Poisson's ratio, such as an auxetic structure. Also, an original having a negative effective Poisson's ratio may be realized by the fact that at least a portion of a mold has a material having a negative Poisson's ratio, such as cristobalite. When a photo-imprint apparatus illuminates a photo (ultraviolet light) curable resin with light via a mold, it is advantageous that the original (mold) is transparent to light. In this case, a structure that is formed of a transparent material and has a negative Poisson's ratio may be useful. This also applies to a transmission-type original (transmission-type mask) for use in an exposure apparatus. Also, an original (mold) for use in a thermal imprint apparatus and a reflection-type original (reflection-type mask) for use in an exposure apparatus do not need to be transparent to light, and thus, a material having a negative Poisson's ratio, such as cristobalite, may be useful. While an original having a negative effective Poisson's ratio has been described above, the original does not necessarily have a negative effective Poisson's ratio. An original having an effective Poisson's ratio smaller than that of the conventional original may also be employed. For example, with respect to a light transmissive original such as an original (photo imprint original) for use in a photo-imprint apparatus, a transmission-type original for use in an exposure apparatus, and the like, an original having an effective Poisson's ratio smaller than that of a conventional original made of quartz (quartz glass plate) may also be employed. Such an original may be realized by the fact that a light transmissive original includes at least either one of a structure having a negative Poisson's ratio or a material having a negative Poisson's ratio.

Next, an example of the auxetic structure according to the present embodiment will be described. FIG. 2C is an enlarged plan view illustrating the auxetic structure portion 22. The auxetic structure portion 22 has a plurality of hollowed portions 24 that are formed with a constant thickness (depth) from the Z-direction while leaving a wall portion 23 (FIG. 2B) with a constant width on the outer circumference portion of the base portion 20 at the back surface side thereof. A continuous rib portion 25 with a constant width is formed by the hollowed portions 24, and thus, the auxetic structure portion 22 is a structure having a negative effective Poisson's ratio. For reducing the effective Poisson's ratio, it is desirable that the thickness of the hollowed portion 24 be more than twice the thickness of the mesa portion 21. In the present embodiment, as shown in FIG. 2C, the formed rib portion 25 has a shape in which a plurality of ridge-like rib portions are continuously formed in the X-direction and the vertexes of the ridge-like rib portions are connected to each other in the Y-direction when viewed from the Z-direction. It should be noted that, in the present embodiment, the auxetic structure portion 22 may be of any structure having a negative effective Poisson's ratio, and is not limited to the shape as shown in FIG. 2C.

Next, a description will be given of the deformation of the mold 3 when the shape correction of the pattern formed on the mold 3 having the auxetic structure portion 22 is made by the shape correction mechanism 11. In the present embodiment, the effective Poisson's ratio of the base portion 20 is negative. Thus, when the shape correction mechanism 11 applies a compressive force to the mold 3 in the X-direction from the peripheral side surface of the mold 3, the mesa portion 21 formed on the base portion 20 is deformed in the Y-direction (shrinkage direction). In contrast, when the shape correction mechanism 11 applies a tensile force to the mold 3 in the X-direction from the peripheral side surface of the mold 3, the mesa portion 21 is deformed in the Y-direction (expansion direction). In other words, by making the effective Poisson's ratio of the base portion 20 negative, the Poisson's ratio of the mesa portion 21 on which a pattern is formed is also substantially negative. In this way, by making the Poisson's ratio of the mesa portion 21 negative, the correction residual of the trapezoidal component of the pattern may be reduced.

Figure 3A:
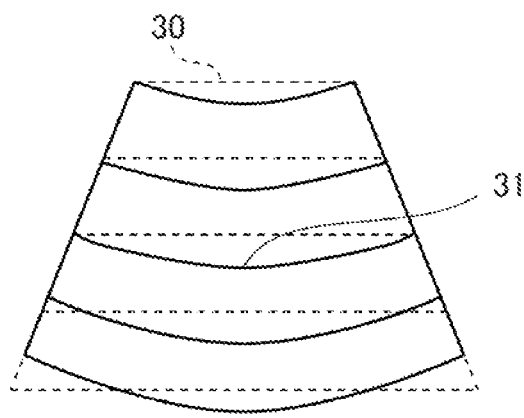
FIG. 3A is a schematic view illustrating a correction of the trapezoidal component of a pattern.
Figure 3B:
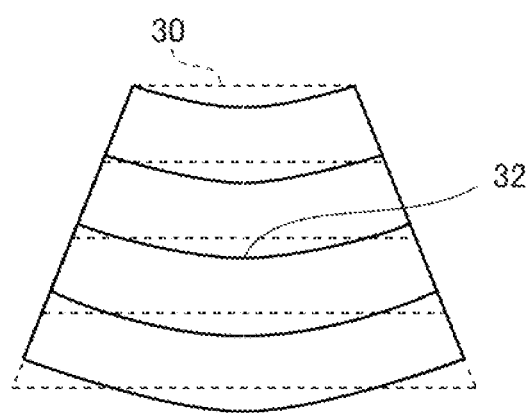
FIG. 3B is a schematic view illustrating another correction of the trapezoidal component of a pattern.
Figure 3C:
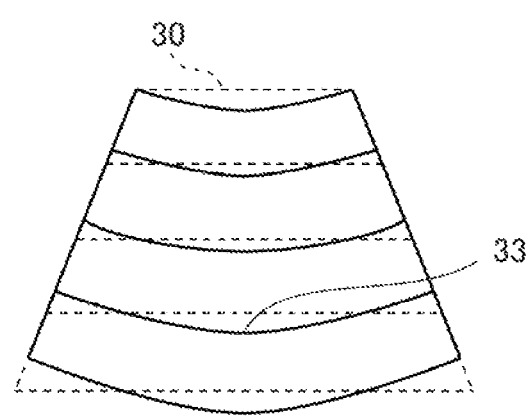
FIG. 3C is a schematic view illustrating another correction of the trapezoidal component of a pattern.

Each of FIGS. 3A to 3C is a schematic view illustrating the deformation of the mesa portion 21 as viewed from the Z-direction when the trapezoidal component of the pattern (the mesa portion 21) is corrected only by a force applied from the peripheral side surface of the mold 3. In FIGS. 3A to 3C, the trapezoid shown by a broken line 30 is the ideal trapezoidal shape to be the target of when the trapezoidal component of the pattern is corrected. In contrast, a solid line 31 shown in FIG. 3A indicates the corrected shape of the mesa portion 21 when the Poisson's ratio of the mesa portion 21 is positive, a solid line 32 shown in FIG. 3B indicates the corrected shape of the mesa portion 21 when the Poisson's ratio of the mesa portion 21 is zero, and a solid line 33 shown in FIG. 3C indicates the corrected shape of the mesa portion 21 when the Poisson's ratio of the mesa portion 21 is negative. In FIGS. 3A to 3C, as the shape represented by each of the solid lines 31 to 33 is closer to the shape represented by the broken line 30, such a shape is closer to the target trapezoidal shape, that is to say, it means that the correction error of the trapezoidal component is small. Thus, as shown in FIG. 3C, the shape having a negative Poisson's ratio, which is represented by the solid line 33, is the closest to the shape represented by the broken line 30, and thus, it can be seen that the correction error of the trapezoidal component is small.

As described above, according to the mold 3 of the present embodiment, at least a partial structure thereof has a negative effective Poisson's ratio, and thus, the shape correction mechanism 11 may preferably deform the pattern shape formed on the mesa portion 21 into the target shape. Consequently, the shape correction mechanism 11 may particularly reduce the correction error of the trapezoidal component of the pattern in addition to the correction error of the magnification component, parallelogram component, and the like of the pattern. Also, according to the mold 3, only the base portion 20 has the auxetic structure portion 22 even when the mesa portion 21 does not have an auxetic structure, and thus, the effect of the present invention may be provided.

Second Embodiment

Figure 4A:
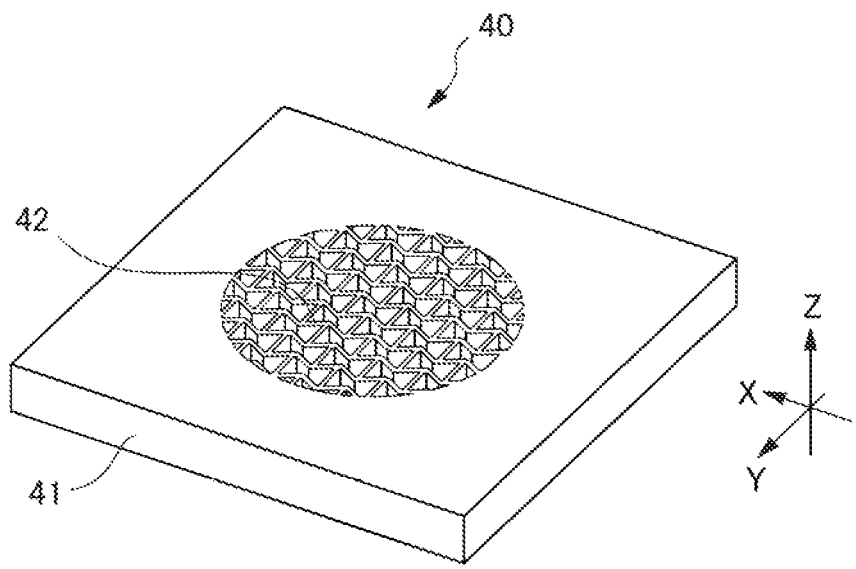
FIG. 4A is a schematic view illustrating the shape of a mold according to a second embodiment.
Figure 4B:
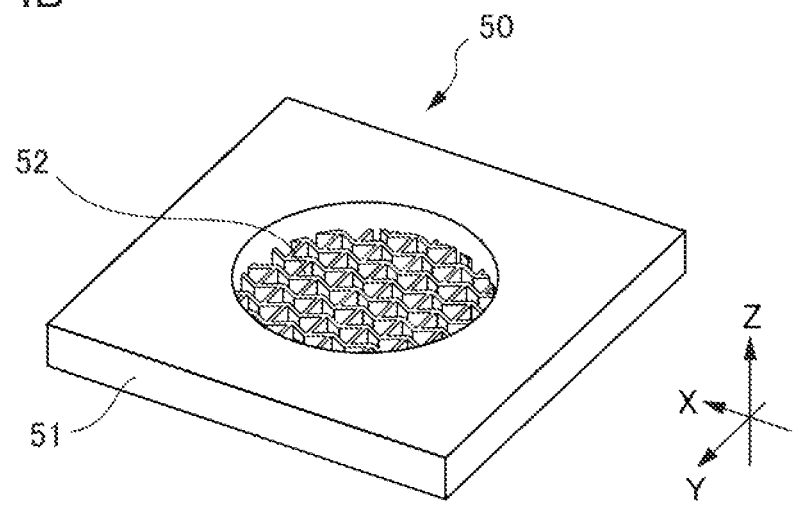
FIG. 4B is a schematic view illustrating another shape of a mold according to the second embodiment.

Next, a description will be given of a mold according to the second embodiment of the present invention. FIG. 4A is a schematic view illustrating the shape of the mold of the present embodiment which is a modification of the mold 3 according to the first embodiment, and FIG. 4B is a perspective view corresponding to FIG. 2B illustrating the mold 3 of the first embodiment. Firstly, although the mold 3 includes the auxetic structure unit 42 formed over the entire back surface of the base portion 20, a mold 40 shown in FIG. 4A includes an auxetic structure unit 42 that is provided near the center of the back surface of a base portion 41, that is, only at the location corresponding to a mesa portion (not shown) formed on the surface side of the base portion 41. With this arrangement, the same effects as those in the first embodiment can be obtained. In addition, a wide area of flat portion to be used for holding the mold 40 by means of, for example, a vacuum pressure or an electrostatic pressure may be set on the back surface of the mold 40. Although the region in which the auxetic structure portion 22 is formed is of circular shape as shown in FIG. 4A, the region may be of polygonal shape such as rectangular shape or the like.

Furthermore, a mold 50 shown in FIG. 4B includes an auxetic structure unit 52 that is provided near the center of the back surface of a base portion 51 as in the mold 40 shown in FIG. 4A and of which the height is one stage lower than that of a peripheral flat portion. With this arrangement, the same effects as those provided by the mold 40 may be obtained. In addition, a mesa portion (not shown) formed on the surface side of the base portion 51 is readily deformed, and thus, a resin may be efficiently filled in the pattern formed on the mesa portion during an imprint operation. The same effects can be obtained even when the auxetic structure unit 52 of the mold 50 is limited to the position corresponding to a part of a lower region, that is, a mesa portion formed on the surface side instead of the fact that the auxetic structure unit 52 is formed on the entire lower region which is one stage lower than a peripheral flat portion.

While, in the foregoing embodiment, an auxetic structure unit is provided on the back surface side of a mold in order to make the effective Poisson's ratio of the mold negative, the present invention is not limited thereto. For example, instead of employing quartz as in the foregoing embodiment, the material constituting the mold may be a material having a Poisson's ratio smaller than that of quartz. In this case, the auxetic structure unit does not need to be formed on the back surface side of the mold. Examples of such material having a Poisson's ratio smaller than that of quartz include cristobalite.

Furthermore, while, in the foregoing embodiment, a description has been given of the original of the present invention as a mold for use in an imprint apparatus, the present invention is not limited thereto. For example, the original of the foregoing embodiment may also be applicable to a mask for use in an exposure apparatus such as so-called scanner, stepper, or the like.

(Article Manufacturing Method)

A method of manufacturing devices (a semiconductor integrated circuit element, liquid crystal display element, and the like) as an article includes a process for transferring (forming) a pattern on a substrate (a wafer, glass plate, or film-like substrate) using the aforementioned imprint apparatus. Furthermore, the manufacturing method can include a process for etching the substrate on which the pattern is transferred. Note that upon manufacturing other articles such as patterned media (recording media) or optical elements, the manufacturing method can include other process for processing the substrate on which the pattern is transferred in place of etching. The article manufacturing method of this embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-198432 filed Sep. 6, 2010 which is hereby incorporated by reference herein in its entirety.

What is claimed is:

1. An original having a pattern to be transferred, wherein the original has a negative effective Poisson's ratio.

2. The original according to claim 1, wherein the original comprises a structure having a negative Poisson's ratio.

3. The original according to claim 1, wherein the original comprises a material having a negative Poisson's ratio.

4. The original according to claim 1, wherein the original comprising:
 a base portion; and
 a mesa portion that protrudes from the base portion and comprises the pattern,
 wherein at least a part of the base portion has a negative Poisson's ratio.

5. The original according to claim 4, wherein the base portion includes the part having the negative Poisson's ratio in a region facing the mesa portion, and the part is not thinner than twice as thick as the mesa portion.

6. The original according to claim 5, wherein the part is thinner than another part of the base portion.

7. The original according to claim 1, wherein the original is a mold to be contacted with an object to be imprinted.

8. The original according to claim 1, wherein the original is a mask via which an object is exposed to radiant energy.

9. A method of manufacturing an article, the method comprising:
 transferring a pattern to an object using an original caused to be deformed in accordance with a target shape; and
 processing the object, on which the pattern has been transferred, to manufacture the article,
 wherein the original has a negative effective Poisson's ratio.

* * * * *